US008614881B2

(12) United States Patent
Yoo

(10) Patent No.: US 8,614,881 B2
(45) Date of Patent: Dec. 24, 2013

(54) MOBILE TERMINAL

(75) Inventor: In Seok Yoo, Seoul (KR)

(73) Assignee: LG Electronics Inc., Seoul (KR)

( * ) Notice: Subject to any disclaimer, the term of this patent is extended or adjusted under 35 U.S.C. 154(b) by 246 days.

(21) Appl. No.: 13/016,810

(22) Filed: Jan. 28, 2011

(65) Prior Publication Data

US 2011/0249378 A1 Oct. 13, 2011

(30) Foreign Application Priority Data

Apr. 9, 2010 (KR) ........................ 10-2010-0032722

(51) Int. Cl.
*H05K 5/00* (2006.01)
*H05K 7/00* (2006.01)
*G06F 3/02* (2006.01)

(52) U.S. Cl.
USPC ............ 361/679.01; 361/679.57; 361/679.58; 345/169

(58) Field of Classification Search
USPC ............. 361/679.01–679.09, 679.21–679.29, 361/679.3, 679.5, 679.51–679.59; 312/273–290, 317.1, 317.2, 317.3, 312/223.1–223.6, 31.1–31.3, 184–193, 312/235.1–235.9, 258–265, 294–316
See application file for complete search history.

(56) References Cited

U.S. PATENT DOCUMENTS 4,170,104 A 10/1979 Yamagata
5,383,166 A 1/1995 Gallay
2004/0256205 A1* 12/2004 Oshio et al. ................ 200/43.13
2007/0074545 A1* 4/2007 Hiranuma et al. ................ 70/25
2008/0062820 A1* 3/2008 Nakamura .................... 368/187

FOREIGN PATENT DOCUMENTS

CH 204295 A 4/1939
EP 0556155 A1 8/1993
EP 1345095 A2 9/2003
EP 1701225 A1 9/2006

* cited by examiner

*Primary Examiner* — Jayprakash N Gandhi
*Assistant Examiner* — Jerry Wu
(74) *Attorney, Agent, or Firm* — Birch, Stewart, Kolasch & Birch, LLP

(57) ABSTRACT

The present invention relates to a mobile terminal, and more particularly, to a mobile terminal having a side key situated at a lateral side of a bezel made of metal. The present invention is to provide a mobile terminal including a side key provided as an input means of which durability against external shock, waterproof capability and maintenance and repair facilitation are enhanced.

20 Claims, 11 Drawing Sheets

(a)

(b)

(a)

(b)

MOBILE TERMINAL

CROSS-REFERENCE TO RELATED APPLICATIONS

Pursuant to 35 U.S.C. §119(a), this application claims the benefit of earlier filing date and right of priority to Korean Application No. 10-2010-0032722, filed on Apr. 9, 2010, the contents of which are hereby incorporated by reference herein in their entirety.

BACKGROUND OF THE INVENTION

1. Field of the Invention

The present invention relates to a mobile terminal, and more particularly, to a mobile terminal having a side key situated at a lateral side of a bezel made of metal.

2. Description of the Related Art

Generally, terminals can be classified into mobile terminals and stationary terminals according to a presence or non-presence of mobility. And, the mobile terminals can be further classified into handheld terminals and vehicle mount terminals according to availability for hand-carry.

As functions of the terminal tend to be diversified, the terminal is implemented as a multimedia player type equipped with composite functions including picture or video photographing, music or video file playback, games, broadcast reception and the like for example.

Recently, a mobile terminal absorbs function of independent multimedia devices and its unique field becoming more diluted.

Moreover, in order to maximize portability of a mobile terminal, mobile terminal of a wristwatch type are being introduced.

Generally, a mobile terminal is provided with a plurality of user input units including various kinds of keys. The user input unit can include a button or a touchscreen. Even if a user input unit of a touchscreen type is provided, a frequently used input key for volume adjustment and the like can be separately provided as a button type.

In case of configuring a mobile terminal of a wrist type, a frequently used input key can be provided to a lateral side of a bezel or the like except a display unit region.

In case of configuring the wristwatch type mobile terminal, an area for installing an input key and the like is not sufficiently provided, unlike a normal mobile terminal.

Moreover, in order to achieve such an object as durability enhancement, design improvement and the like, an exterior of a wristwatch is generally made of metal.

Although an input key is occasionally provided to a wristwatch, in case that a mobile terminal capable of communication functionality is configured into a wristwatch type, it should be assumed that a use frequency of the input key increases. In particular, a use frequency increases. And, penetration of water into a mobile terminal loaded with circuit components should be prevented.

Therefore, in case of configuring a mobile terminal capable of communication functionality into a wristwatch type, if an input key is provided to a lateral side of a bezel, a frequency use of the input key increases. And, durability against external shock, waterproof capability and maintenance and repair facilitation need to be enhanced.

BRIEF SUMMARY OF THE INVENTION

Accordingly, the present invention is directed to a mobile terminal that substantially obviates one or more problems due to limitations and disadvantages of the related art.

An object of the present invention is to provide a mobile terminal including a side key provided as an input means of which durability against external shock, waterproof capability and maintenance and repair facilitation are enhanced.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a mobile terminal according to the present invention includes a display unit, a bezel member configured to accommodate the display unit to expose, the bezel member made of a metal material, at least one side key including a head part externally exposed via a lateral side of the bezel member and a penetrating part extending into the bezel member, a loading member provided to the bezel member, the loading member having a loading recess configured to load the head part of the side key thereon, and a bushing member locked with the bezel member by holding the loading member to fix the loading member to the bezel member.

Preferably, the bezel member includes a locking hole for locking the hushing member and the penetrating part of the side key extends toward a signal input unit provided within the bezel member via the bushing member locked in the locking hole provided to the bezel member.

More preferably, the signal input unit includes a dome switch configured to generate a control signal by being selectively pressurized by the penetrating part of the side key.

More preferably, screw threads are formed on an outer lateral side of the bushing member and an inner lateral side of the locking hole, respectively and the bushing member and the bezel member are screwed to each other via the screw threads.

More preferably, a step difference is provided to an outer lateral side of the bushing member and the step difference is supported by a bottom side of the loading member.

More preferably, a guide recess is formed on a bottom side of the head part of the side key, an upper part of the bushing member, which is not inserted into the loading member or the locking hole of the bezel member, is inserted in the guide recess, and the upper part of the bushing member is guided by the guide recess in case of pressurizing the side key.

In this case, an elastic member is provided within the bushing member to provide an elastically repulsive force toward the head part of the side key in case of pressurizing the side key. The elastic member includes a coil spring, one end of the coil spring is supported within the bushing member, and the other end of the coil spring is brought into contact with a bottom side of the guide groove.

Moreover, a sealing member is provided within the bushing member to prevent particles from being introduced into the mobile terminal. In this case, a partitioning member is provided between the elastic member and the sealing member to separate the elastic member and the sealing member from each other. And, an auxiliary sealing member is further provided between the guide recess and an outer lateral side of the upper part of the bushing member.

More preferably, an auxiliary guide recess is formed on the bottom side of the head part of the side key by leaving the guide recess in-between and a guide bar is provided to a bottom side of the loading recess of the loading member to be guided by being inserted in the auxiliary guide recess.

Preferably, the head part of the side key and the loading recess of the loading member have circular shapes, respectively and a diameter of the head part of the side key is smaller than that of the loading recess of the loading member.

More preferably, a guide recess is formed on the bottom side of the head part of the side key to enable the upper part of the bushing member to be inserted therein and at least one rotation preventing projection and at least one rotation preventing recess are provided to an outer lateral side of the bushing member and an inner lateral side of the guide recess to mutually engage with each other, respectively.

In this case, the rotation preventing projection and the rotation preventing recess are formed in a direction in parallel with a displacement direction of the side key.

Preferably, a shape of the loading recess of the loading member corresponds to that of the head part of the side key.

Preferably, the mobile terminal further includes at least two side keys and at least one of the at least two side keys is loaded on a curved lateral side of the bezel member.

More preferably, a portion of the lateral side of the bezel member, on which the at least one loading member is loaded, is recesses or has a step difference.

Preferably, the bezel member is formed by forging.

Preferably, a hooking recess is formed on an outer lateral side of an end portion of the side key extending by penetrating the bezel member and a fixing ring is loaded on the hooking recess to prevent the side key from being separated from the bezel member.

In another aspect of the present invention, a mobile terminal includes a forged bezel member configured to enable a display unit to be exposed in a circular or overall shape, at least one side key loaded on a lateral side of the bezel member to generate a control signal according to a selective pressurization, a bushing member screwed to the bezel member by penetrating the bezel member to load the side key on the lateral side of the bezel member displaceably, and a band member provided to both ends of the bezel member.

Accordingly, the present invention provides the following effects and/or advantages.

First of all, the present invention provides a mobile terminal including a side key provided as an input means of which durability against external shock, waterproof capability and maintenance and repair facilitation are enhanced.

Secondly, the present invention configures a bezel member of a mobile terminal with a metal material fabricated by a forging process, thereby improving an exterior of the mobile terminal to enhance the product value.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. The above and other aspects, features, and advantages of the present invention will become more apparent upon consideration of the following description of preferred embodiments, taken in conjunction with the accompanying drawing figures. In the drawings.

DETAILED DESCRIPTION OF THE INVENTION

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

Figure 1:
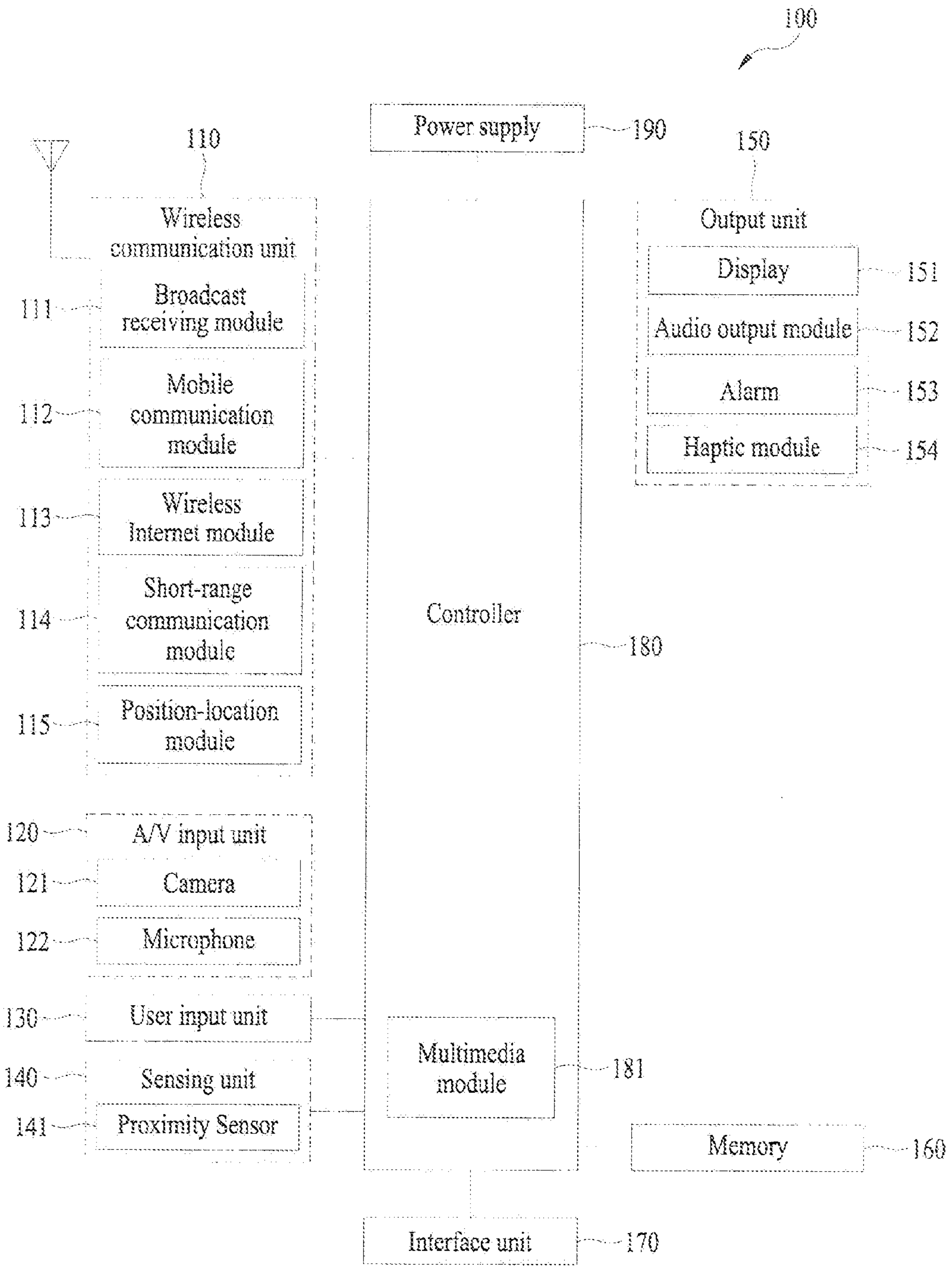
FIG. 1 is a block diagram of a mobile terminal according to an embodiment of the present invention.

FIG. 1 is a block diagram of a mobile terminal 100 in accordance with an embodiment of the present invention.

FIG. 1 shows the mobile terminal 100 according to one embodiment of the present invention includes a wireless communication unit 110, an A/V (audio/video) input unit 120, a user input unit 130, a sensing unit 140, an output unit 150, a memory 160, an interface unit 170, a controller 180, a power supply unit 190 and the like. FIG. 1 shows the mobile terminal 100 having various components, but it is understood that implementing all of the illustrated components is not a requirement. Greater or fewer components may alternatively be implemented.

The wireless communication unit 110 typically includes one or more components which permits wireless communication between the mobile terminal 100 and a wireless communication system or network within which the mobile terminal 100 is located. For instance, the wireless communication unit 110 can include a broadcast receiving module 111, a mobile communication module 112, a wireless internet module 113, a short-range communication module 114, a position-location module 115 and the like.

The broadcast receiving module 111 receives a broadcast signal and/or broadcast associated information from an external broadcast managing server via a broadcast channel.

The broadcast channel may include a satellite channel and a terrestrial channel.

The broadcast managing server generally refers to a server which generates and transmits a broadcast signal and/or broadcast associated information or a server which is provided with a previously generated broadcast signal and/or broadcast associated information and then transmits the provided signal or information to a terminal.

The broadcast signal may be implemented as a TV broadcast signal, a radio broadcast signal, and a data broadcast signal, among others. If desired, the broadcast signal may further include a broadcast signal combined with a TV or radio broadcast signal.

The broadcast associated information includes information associated with a broadcast channel, a broadcast program, a broadcast service provider, etc. And, the broadcast associated information can be provided via a mobile communication network. In this case, the broadcast associated information can be received by the mobile communication module 112.

The broadcast associated information can be implemented in various forms. For instance, broadcast associated information may include an electronic program guide (EPG) of digital multimedia broadcasting (DMB) and electronic service guide (ESG) of digital video broadcast-handheld (DVB-H).

The broadcast receiving module 111 may be configured to receive broadcast signals transmitted from various types of broadcast systems. By nonlimiting example, such broadcasting systems include digital multimedia broadcasting-terrestrial (DMB-T), digital multimedia broadcasting-satellite (DMB-S), digital video broadcast-handheld (DVB-H), DVB-CBMS, OMA-BCAST, the data broadcasting system known as media forward link only (MediaFLO®) and integrated services digital broadcast-terrestrial (ISDB-T). Optionally, the broadcast receiving module 111 can be configured suitable for other broadcasting systems as well as the above-explained digital broadcasting systems.

The broadcast signal and/or broadcast associated information received by the broadcast receiving module 111 may be stored in a suitable device, such as a memory 160.

The mobile communication module 112 transmits/receives wireless signals to/from one or more network entities (e.g., base station, external terminal, server, etc.). Such wireless signals may represent audio, video, and data according to text/multimedia message transceivings, among others.

The wireless internet module 113 supports Internet access for the mobile terminal 100. This module may be internally or externally coupled to the mobile terminal 100. In this case, the wireless Internet technology can include WLAN (Wireless LAN) (Wi-Fi), Wibro (Wireless broadband). Wimax (World Interoperability for Microwave Access), HSDPA (High Speed Downlink Packet Access), etc.

The short-range communication module 114 facilitates relatively short-range communications. Suitable technologies for implementing this module include radio frequency identification (RFID), infrared data association (IrDA), ultra-wideband (UWB), as well at the networking technologies commonly referred to as Bluetooth and ZigBee, to name a few.

The position-location module 115 identifies or otherwise obtains the location of the mobile terminal 100. If desired, this module may be implemented with a global positioning system (GPS) module.

Meanwhile, the A/V (audio/video) input unit 120 is configured to input an audio signal or a video signal and can include a camera module 121, a microphone module 122 and the like. The camera module 121 processes an image frame of a still or moving picture obtained by an image sensor in a video call mode or a photographing mode. And, the processed image frame can be displayed on the display 151.

The image frame processed by the camera module 121 is stored in the memory 160 or can be externally transmitted via the wireless communication unit 110. At least two camera modules 121 can be provided according to a configuration type of the terminal.

The microphone 122 receives an external audio signal while the portable device is in a particular mode, such as phone call mode, recording mode and voice recognition. This audio signal is processed and converted into electric audio data. The processed audio data is transformed into a format transmittable to a mobile communication base station via the mobile communication module 112 in case of a call mode. The microphone 122 typically includes assorted noise removing algorithms to remove noise generated in the course of receiving the external audio signal.

The user input unit 130 generates input data responsive to user manipulation of an associated input device or devices. Examples of such devices include a keypad, a dome switch, a touchpad such as static pressure/capacitance, a jog wheel and a jog switch. A specific example is one in which the user input unit 130 is configured as a touchpad in cooperation with a display, which will be described in more detail below.

The sensing unit 140 detects such a current configuration of the mobile terminal 100 as an open/closed configuration of the mobile terminal 100, a location of the mobile terminal 100, a presence or non-presence of user contact, a direction of the mobile terminal, acceleration/deceleration of the mobile terminal, and the like and then generates a sensing signal for controlling an operation of the mobile terminal 100.

For instance, if the mobile terminal 100 is a slide phone type, the sensing unit 140 is able to sense whether a slide phone is open or closed. And, the sensing unit 140 is responsible for sensing functions related to a presence or non-presence of power supply of the power supply 190, an external device loading of the interface unit 170 and the like.

Meanwhile, the sensing unit 140 may include a proximity sensor 141.

The output unit 150 is configured to output an audio signal, a video signal and/or an alarm signal. And, the output unit 150 may include the display 151, an audio output module 152, an alarm output module 153, a haptic module 154 and the like.

The display 151 is typically implemented to visually display (output) information associated with the mobile terminal 100. For instance, if the mobile terminal is operating in a phone call mode, the display will generally provide a user interface (UI) or graphical user interface (GUI) which includes information associated with placing, conducting, and terminating a phone call.

The display 151 may be implemented using known display technologies including, for example, a liquid crystal display (LCD), a thin film transistor-liquid crystal display (TFT-LCD), an organic light-emitting diode display (OLED), a flexible display and a three-dimensional display. The mobile terminal 100 may include one or more of such displays.

Some of the displays can have a transparent or light-transmitting configuration to be externally viewable therethrough. And, such a display can be called a light-transmitting display. TOLED (transparent OLED), AMOLED (active matrix OLED) and the like are representative examples of the light-transmitting displays. And, a rear structure of the display can have the light-transmitting configuration as well. According to this configuration, a user is able to see an object located behind the terminal body through the region occupied by the display unit 151 of the terminal body.

According to an implementation type of the mobile terminal 100, at least two displays 151 can exist in the mobile terminal 100. For instance, a plurality of displays can be arranged on one face of the mobile terminal 100 in a manner of being spaced apart from each other or being built in one body. For another instance, a plurality of displays can be arranged on different faces of the mobile terminal 100, respectively.

In case that the display 151 and a sensor for detecting a touch action (hereinafter called 'touch sensor') of such a pointer as a user's finger, a pen and the like configures a mutual layer structure (hereinafter called 'touchscreen'), it is able to use the display 151 as an input device as well as an output device. In this case, the touch sensor can be configured with a touch film, a touch sheet, a touchpad or the like for example.

The touch sensor can be configured to convert a pressure applied to a specific portion of the display 151 or a variation of a capacitance generated from a specific portion of the display, 151 to an electric input signal. Moreover, it is able to configure the touch sensor to detect a pressure of a touch as well as a touched position or size.

If a touch input is made to the touch sensor, signal(s) corresponding to the touch is transferred to a touch controller. The touch controller processes the signal(s) and then transfers the processed signal(s) to the controller 180. Therefore, the controller 180 is able to know which portion of the display 151 is touched.

A proximity sensor 141 can be provided to an internal area of the mobile terminal 100 enclosed by the touchscreen or around the touchscreen. The proximity sensor is the sensor that detects a presence or non-presence of an object approaching a prescribed detecting surface or an object existing around the proximity sensor using an electromagnetic field strength or infrared ray without mechanical contact. Hence, the proximity sensor has durability longer than that of a contact type sensor and also has utility wider than that of the contact type sensor.

The proximity sensor can include one of a transmittive photoelectric sensor, a direct reflective photoelectric sensor, a mirror reflective photoelectric sensor, a radio frequency oscillation proximity sensor, an electrostatic capacity proximity sensor, a magnetic proximity sensor, an infrared proximity sensor and the like. In case that the touchscreen includes the electrostatic capacity proximity sensor, it is configured to detect the proximity of a pointer using a variation of electric field according to the proximity of the pointer. In this case, the touchscreen (touch sensory can be classified as the proximity sensor.

In the following description, for clarity, an action that a pointer approaches without contacting with the touchscreen to be recognized as located on the touchscreen is named 'proximity touch'. And, an action that a pointer actually touches the touchscreen is named 'contact touch'. The meaning of the position on the touchscreen proximity-touched by the pointer means the position of the pointer which vertically opposes the touchscreen when the pointer performs the proximity touch.

The proximity sensor detects a proximity touch and a proximity touch pattern (e.g., a proximity touch distance, a proximity touch duration, a proximity touch position, a proximity touch shift state, etc.). And, information corresponding to the detected proximity touch action and the detected proximity touch pattern can be outputted to the touchscreen.

The audio output module 152 functions in various modes including a call-receiving mode, a call-placing mode, a recording mode, a voice recognition mode, a broadcast reception mode and the like to output audio data which is received from the wireless communication unit 110 or is stored in the memory 160. During operation, the audio output module 152 outputs audio relating to a particular function (e.g., call received, message received, etc.). The audio output module 152 is often implemented using one or more speakers, buzzers, other audio producing devices, and combinations thereof.

The alarm unit 153 is output a signal for announcing the occurrence of a particular event associated with the mobile terminal 100. Typical events include a call received event, a message received event and a touch input received event. The alarm unit 153 is able to output a signal for announcing the event occurrence by way of vibration as well as video or audio signal. The video or audio signal can be outputted via the display 151 or the audio output unit 152. Hence, the display 151 or the audio output module 152 can be regarded as a part of the alarm unit 153.

The haptic module 154 generates various tactile effects that can be sensed by a user. Vibration is a representative one of the tactile effects generated by the haptic module 154. Strength and pattern of the vibration generated by the haptic module 154 are controllable. For instance, different vibrations can be outputted in a manner of being synthesized together or can be outputted in sequence.

The haptic module 154 is able to generate various tactile effects as well as the vibration. For instance, the haptic module 154 generates the effect attributed to the arrangement of pins vertically moving against a contact skin surface, the effect attributed to the injection/suction power of air though an injection/suction hole, the effect attributed to the skim over a skin surface, the effect attributed to the contact with electrode, the effect attributed to the electrostatic force, the effect attributed to the representation of hold/cold sense using an endothermic or exothermic device and the like.

The haptic module 154 can be implemented to enable a user to sense the tactile effect through a muscle sense of finger, arm or the like as well as to transfer the tactile effect through a direct contact. Optionally, at least two haptic modules 154 can be provided to the mobile terminal 100 in accordance with the corresponding configuration type of the mobile terminal 100.

The memory 160 can store programs for the processing and control of the controller 180 and is also able to perform a function for temporary storage of inputted/outputted data (e.g., phonebook data, message data, still picture data, moving picture data, etc.). Moreover, the memory 160 can store data of various patterns of vibration and sound outputted in case of the touch input to the touchscreen.

The memory 160 may include at least one storage medium of such a type as a flash memory type, a hard disk type, a multimedia card micro type, a card type memory (e.g., SD memory, XD memory, etc.), RAM, SRAM (Static Random Access Memory), ROM, EEPROM (Electrically Erasable Programmable Read-Only Memory), PROM (Programmable Read-Only Memory) and the like. Moreover, the mobile terminal 100 is able to operate a web storage that performs a storage function of the memory 160 on internet.

The interface unit 170 plays a role as an interface with every external device connected to the mobile terminal 100. For instance, the external devices include a wire/wireless headset, an external electricity charger, a wire/wireless data port, a card socket (e.g., memory card socket, SIM/UIM card socket, etc.), audio I/O (input/output) terminals, video I/O (input/output) terminals, earphones, etc. The interface unit 170 receives data from the external device or is supplied with power. The interface unit 170 then delivers the received data or the supplied power to the corresponding component within the mobile terminal 100 or transmits data within the portable terminal 100 to the corresponding external device.

The identity module is the chip for storing various kinds of information for authenticating a use authority of the mobile terminal 100 and can include User Identify Module (UIM), Subscriber Identify Module (SIM), Universal Subscriber Identity Module (USIM) and/or the like. A device having the identity module (hereinafter called 'identity device') can be manufactured as a smart card. Therefore, the identity device is connectable to the mobile terminal 100 via the corresponding port.

When the mobile terminal 110 is connected to an external cradle, the interface unit 170 becomes a passage for supplying the mobile terminal 100 with a power from the cradle or a passage for delivering various command signals inputted from the cradle by a user to the mobile terminal 100. Each of the various command signals inputted from the cradle or the power can operate as a signal enabling the mobile terminal 100 to recognize that it is correctly loaded in the cradle.

The controller 180 normally controls overall operations of the mobile terminal 100. For instance, the controller 180 performs the control and processing related to speech call, data communication, video call and the like. And, the controller 180 can be provided with a multimedia play module 181 for multimedia playback as well. The multimedia playback module 180 can be configured as hardware within the controller 180 or software separate from the controller 180.

The controller 180 is able to perform a pattern recognizing processing for recognizing a handwriting input or a drawing input performed on the touchscreen into a character and an image, respectively.

The power supply 190 receives an external and/or internal power source and then supplies power required for operations of the respective components, under the control of the controller 180.

Various embodiments described herein may be implemented in a computer-readable medium using, for example, computer software, hardware, or some combination thereof.

For a hardware implementation, the embodiments described herein may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a selective combination thereof. Such embodiments may also be implemented by the controller 180.

For a software implementation, the embodiments described herein may be implemented with separate software modules, such as procedures and functions, each of which perform one or more of the functions and operations described herein. The software codes can be implemented with a software application written in any suitable programming language and may be stored in the memory 160, and executed by the controller 180.

Figure 2:
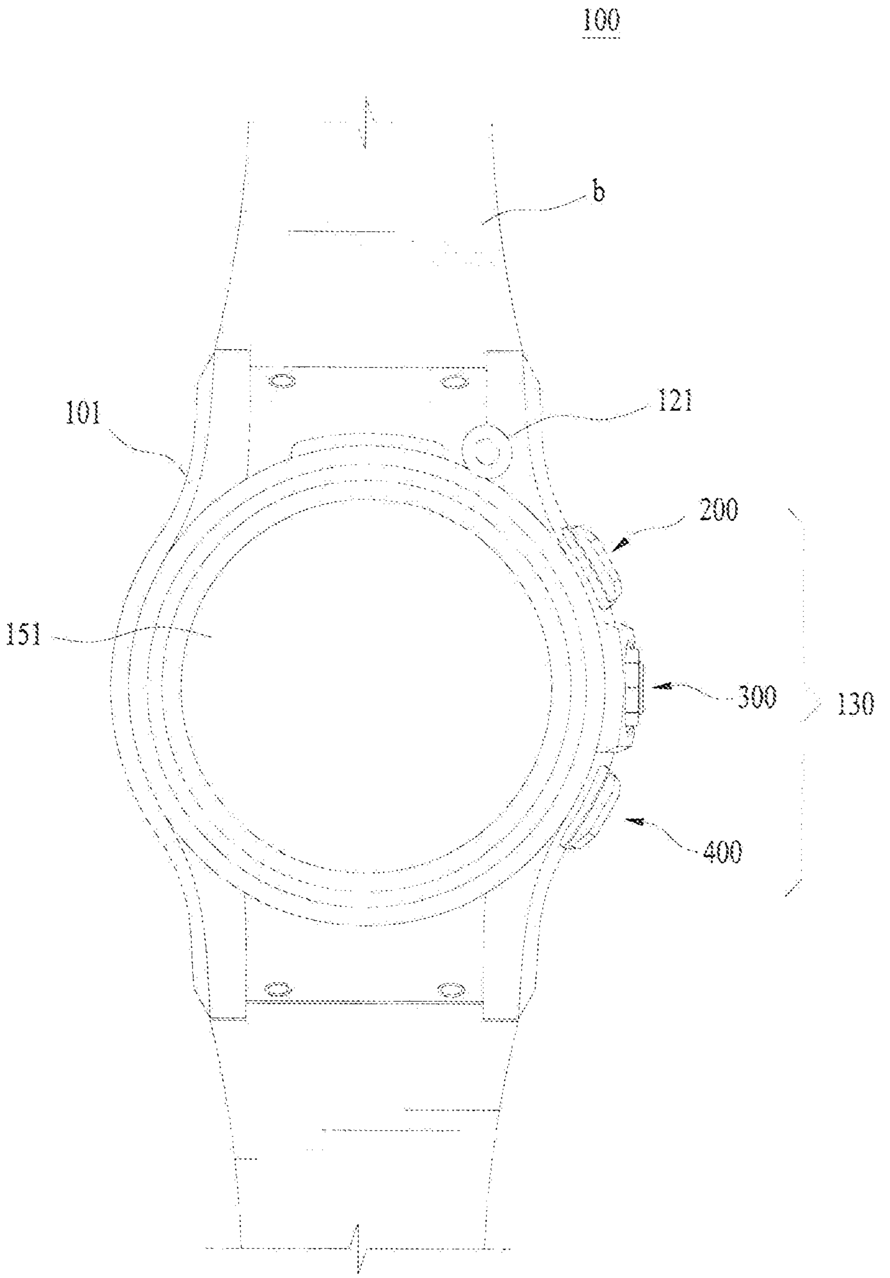
FIG. 2 is a diagram of a mobile terminal according to one embodiment of the present invention.

FIG. 2 is a diagram of a mobile terminal according to one embodiment of the present invention.

Referring to FIG. 2, a mobile terminal 100 according to the present invention can be configured into a wristwatch type wearable on a user's wrist or the like unlike a normal mobile terminal.

In the mobile terminal 100 shown in FIG. 2, a display unit 151 is exposed in front direction. Various kinds of informations are displayed on the display unit 151. A touchscreen is available for the display unit 151. And, an illumination function can be provided to the display unit 151. Like a wristwatch, the display unit 151 can have a circular shape. And, a bezel member 101 for accommodating the display unit 151 therein can be provided to enable the display unit 151 to be exposed in front direction.

The bezel member 101 forms an exterior of the mobile terminal 100 and can be made of a metal material due to durability, design and the like.

The bezel member 101 can be grinded to give a predetermined feel of the material to its surface. In order to secure rigidity, the bezel member 101 can be fabricated by a forging process.

In this case, the forging process means a process for shaping a metal material mechanically in a manner of hammering or pressurizing the metal material. A temperature for pressurizing the metal material may be a room temperature. Yet, if a material has a high melting point, it often needs to be heated more or less. Generally, if a material is forged at a temperature higher than a re-crystallization temperature of the material, it is called 'hot forging'. If a material is forged at a temperature lower than a re-crystallization temperature of the material, it is called 'cold forging'. Thus, the forging process is able to homogenize the structure of the metal material.

A pressurizing step of the forging process is performed using one of a hammer, a press and the like. Since the forging process adopts a hammering or pressurizing manner, prescribed limitation is put on shaping unlike a casting process for manufacturing a specific shape by putting melted metal into a cast. Yet, the forging process enables a dense structure, secures rigidity, and provides an excellent surface quality after post-processing.

Since the mobile terminal 100 according to the present invention is configured into a wristwatch type on the assumption that the mobile terminal 100 is wearable on a wrist or the like, the bezel member 101 fabricated by the forging process is used as a housing, which configures an exterior of the mobile terminal, to provide shock-resistance to the mobile terminal. In this case, the bezel member 101 includes an opening to enable a front side of the display unit 151 to be externally exposed. Therefore, in case that the display unit 151 includes a touchscreen, the display unit 151 can be used as a user input unit for inputting various user inputs.

Besides, like a normal mobile terminal including a touchscreen, an input key configuring the user input unit can be provided to a lateral side of the mobile terminal 100 according to the present invention.

The mobile terminal 100 shown in FIG. 2 is provided with a user input unit 130 having a plurality of side key assemblies 200, 300 and 400 located at a lateral side of the bezel member 101 configuring the exterior of the mobile terminal 100.

In this case, each of the side key assemblies 200, 300 and 400 is defined as a set of components to load a corresponding side key on the bezel member 101 pressurizably.

Each of the side key assemblies 200, 300 and 400 can be provided to generate an input signal of a function having a high use frequency. Each of the side key assemblies 200, 300 and 400 provided to the lateral side of the bezel member 101 is operable by a touch or pressurization. Yet, since the mobile terminal 100 is worn by being brought into contact with a human body, a control signal can be set to be generated not by the touch but by the pressurization.

A method of loading side keys respectively configuring the side key assemblies 200, 300 and 400 pressurizably on the lateral side of the bezel member 101 shall be described later.

Meanwhile, a camera 121 can be provided to the bezel member 101. In this case, the camera 121 is usable in photographing a video image and video information on a video call.

A band member b for wearing on a wrist or the like is provided to top and bottom of the bezel member 101. In this case, the band member b can be made of at least one of resin, leather, metal and the like. And, the band member b can be detachably attached to the bezel member 101 or the like.

In the following description, a side key assembly of a mobile terminal according to one embodiment of the present invention and a method of loading the side key assembly are explained with reference to FIG. 3.

Figure 3:
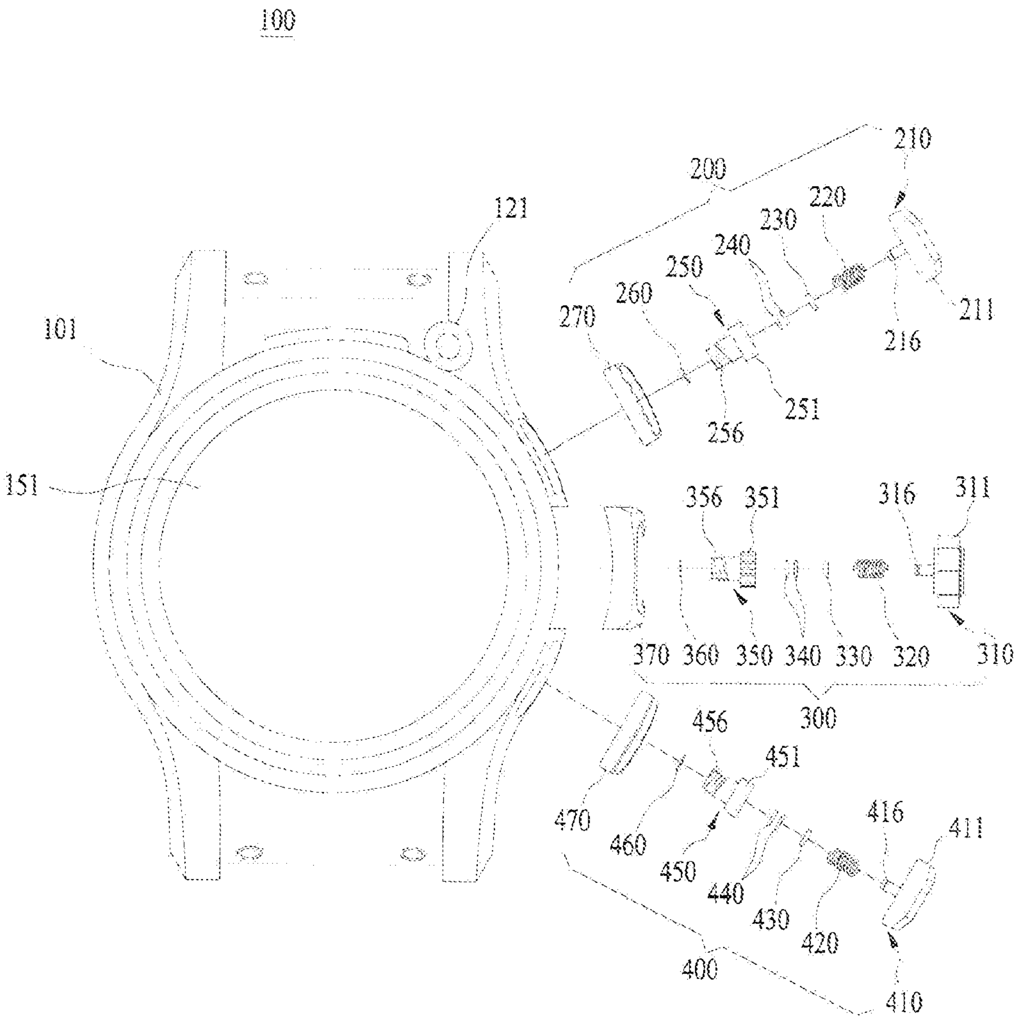
FIG. 3 is an exploded layout of side key assemblies 200, 300 and 400 of a mobile terminal 100 according to the present invention.

FIG. 3 is an exploded layout of side key assemblies 200, 300 and 400 of a mobile terminal 100 according to the present invention.

Referring to FIG. 3, a mobile terminal 100 according to the present invention includes a display unit 151, a bezel member 101 formed of a metal material, the bezel member 101 configured to support an edge of the display unit 151 to expose a front side of the display unit 151 externally, at least one or more side keys 210, 310 and 410, each including a head part configured to be externally exposed via a lateral side of the bezel member 101 and a penetrating part of a bar type configured to extend into the bezel member 101, at least one or more loading members 270, 370 and 470 configured to be loaded on the bezel member 101, each having a loading recess configured to enable the head part of the corresponding side key to be loaded thereon, at least one or more locating holes provided to the lateral side of the bezel member 101, and at least one or more bushing members 250, 350 and 450 of a pipe type, each locked with the bezel member 101 to lock the corresponding member to the bezel member 101.

At least one of the side keys 210, 310 and 410 is provided to the lateral side of the bezel member 101. The side keys 210, 310 and 410 include the head parts 211, 311 and 411 configured to be externally exposed via the lateral side of the bezel member 101 and the penetrating parts 216, 316 and 416 extending into the bezel member 101, respectively.

A user is able to input a control signal by pressurizing or touching a topside of each of the head parts 211, 311 and 411. The head parts 211, 311 and 411 are loaded on the loading members 270, 370 and 470 configured to having the penetrating parts 216, 316 and 416 extend into the bezel member 101 by penetrating the bezel member 101, respectively.

Concave loading recesses can be provided within the loading members 270, 370 and 470 to enable the head parts 211, 311 and 411 of the side keys 210, 310 and 410 to be loaded thereon. Preferably, each of the loading recesses is configured to have a shape corresponding to that of the head part of the corresponding side key.

In this case, the locking holes (described later) for locking the bushing members 250, 350 and 450 can be provided to the bezel member 101. And, the penetrating parts 216, 316 and 416 of the side keys can extend to a signal input unit provided within the bezel member 101 via the bushing member 250, 350 and 450 locked with the locking holes formed on the bezel member 101, respectively.

In this case, the signal input unit can include a dome switch configured to generate a control signal by being selectively pressurized by each of the penetrating parts 216, 316 and 416 of the side keys, respectively.

In the above description, the side keys 310, 310 and 410 are loaded on the loading recesses using the loading members 270, 370 and 470, respectively. This is to absorb the shock applied in a lateral side direction of each of the side keys 210, 310 and 410 and to protect each of the side keys 210, 310 and 410.

In particular, an outer lateral side of each of the loading members 270, 370 and 470 can play a role as a shock-absorber. In case that the dome switch or the like is provided as the signal input unit situated within the mobile terminal, each of the side keys 210, 310 and 410 should be displaceably loaded to pressurize the dome switch or the like. Therefore, each of the side keys 210, 310 and 410 is not in a stationary state. In order to prevent separation or damage caused by an externally applied shock, the side keys 210, 310 and 410 can be loaded on the bezel member 101 via the loading members 270, 370 and 470, respectively.

In the above description, the loading recesses are not directly formed on the lateral side of the bezel member 101. This is because it is difficult to form a recessed portion in various directions due to the forging process or because an additional forming process may be required. In particular, in case of forming the bezel member 101 by applying pressurization in a direction of ground shown in FIG. 3, using a separate loading member having a loading recess can be more efficient than forming a recessed part in a direction vertical to the pressurized direction.

Each of the loading members 270, 370 and 470 can be made of a metal material to secure uniformity and rigidity of an exterior.

Therefore, in order to load the loading members 270, 370 and 470 on the lateral side of the bezel member 101 and to enable the side keys 210, 310 and 410 to penetrate the bezel member 101 inward, it is able to use the bushing members 250, 350 and 450, respectively. The locking holes are formed on the lateral side of the bezel member 101. And, the bushing members 250, 350 and 450 fix the loading members 270, 370 and 470 to the bezel member 101, respectively.

In this case, each of the bushing members 250, 350 and 450 can be configured into a pipe type. And, the bushing members 250, 350 and 450 are locked with the bezel member 101 by holding the loading members 270, 370 and 470, respectively.

The bushing members shall be explained in detail later in this description.

Meanwhile, sealing members 240, 340 and 440 and elastic members 220, 320 and 420 can be provided within the bushing members 250, 350 and 450, respectively. In this case, the sealing members 240, 340 and 440 are provided to guarantee waterproof and the like. In case that the side keys 210, 310 and 410 are pressurized, the elastic members 220, 320 and 420 provide elastically repulsive forces to enable the side keys 210, 310 and 410 to their original positions, respectively.

Figure 4:
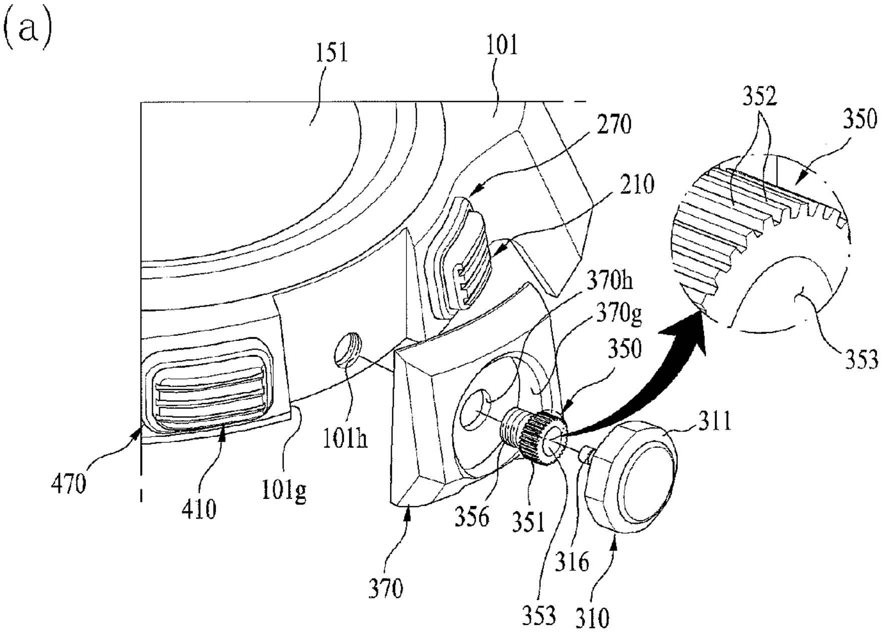
FIG. 4 and FIG. 5 are diagrams for explaining a process for loading a side key of a mobile terminal according to one embodiment of the present invention.
Figure 4:
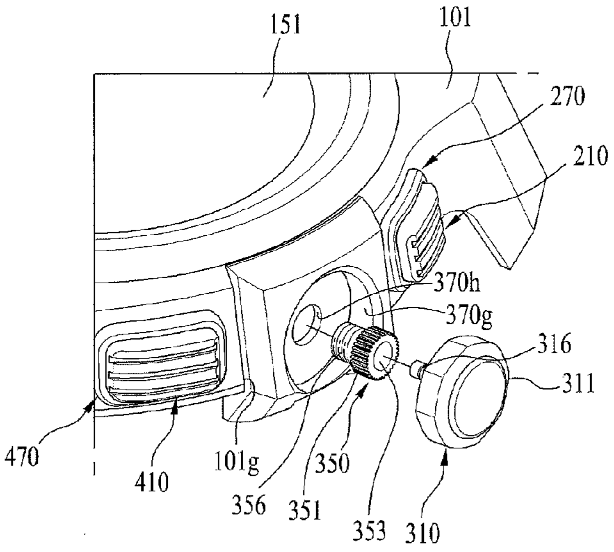
Figure 5:
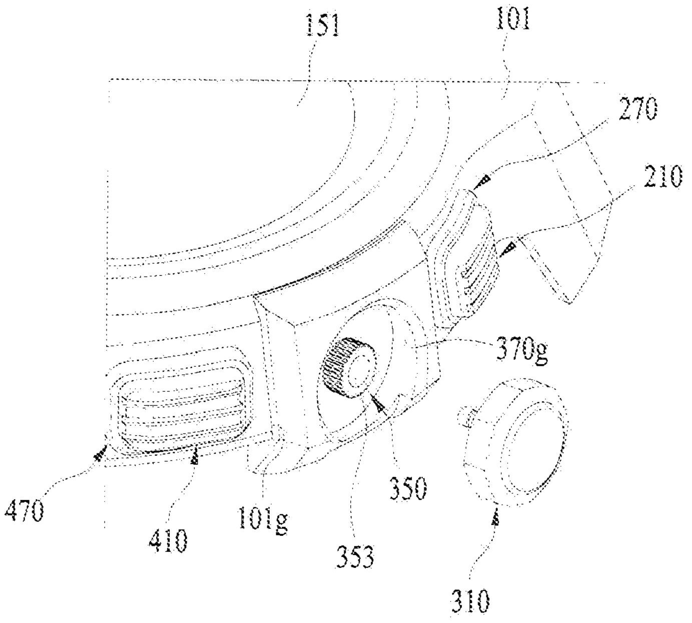
Figure 5:
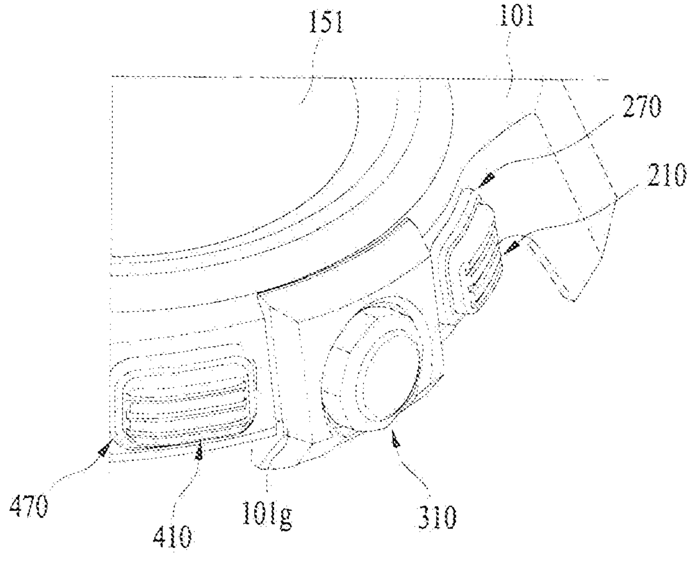

FIG. 4 and FIG. 5 are diagrams for explaining a process for loading a side key of a mobile terminal according to one embodiment of the present invention. As the side keys 210, 310 and 410 shown in FIG. 3 have the almost same configurations and loading mechanisms, FIG. 4 and FIG. 5 show the process for loading the side key 310 on a center of the lateral side of the bezel member 101.

In particular, FIG. 4 (*a*) is an exploded perspective diagram of the loading member 370, the bushing member 350 and the side key 310. FIG. 4 (*b*) shows a state that the loading member 370 is seated on the bezel member 101 in conjunction with the state shown in FIG. 4 (*a*). FIG. 5 (*a*) shows a state that the bushing member 350 is locked in conjunction with the state shown in FIG. 4 (*b*). And, FIG. 5 (*b*) shows a state that the side key is loaded in conjunction with the state shown in FIG. 5 (*a*).

Referring to FIG. 4 and FIG. 5, total 3 side keys 210, 310 and 410 are loaded on the bezel member 101 of the mobile terminal. Assume that the left and right side keys 210 and 410 have been already assembled.

The mobile terminal according to the present invention includes at least two side keys. At least one of the at least two side keys can be loaded on a curved lateral side of the bezel member 101.

In this case, a recessed part 101*g* for loading the loading member 370 thereon can be formed on the curved lateral side of the bezel member 101. The recessed part 101*g* is a part that is recessed in a shape corresponding to a bottom side of the loading member 370 to have a step difference and is able to play a role in determining a loaded position of the loading member 370. And, a locking hole 101*h* can be formed at a position corresponding to the penetrating part 316 of the side key 310 within the recessed part 101*g*.

The locking hole 101*h* is locked with the bushing member 350. And, the locking hole 101*h* is a passage for the penetrating part 316 of the side key 310 to extend into the mobile terminal via the bushing member 350.

Meanwhile, a loading recess 370*g* can be formed at the loading member 370 to enable a head part 311 of the side key 310 to be loaded thereon. In this case, a penetrating hole 370 can be formed within the loading recess 370 to correspond to the penetrating part 316 and a lower part of the bushing member 350.

The bushing member 350 is able to fix the loading member 370 to the bezel member 101 in a manner that the lower part 356 of the bushing member 350 penetrates the penetrating hole 370*h* of the loading member 370 and the locking hole 101*h* of the recessed part 101*g* in turn.

In this case, an inner diameter of the penetrating hole 370*h* of the loading member 370 is preferably set smaller than an outer diameter of the upper part 351 of the bushing member 350. This is to prevent the bushing member 350 from being inserted into the penetrating hole 370*h* in a manner of putting limitation on an insertion distance of the bushing member 350.

Thus, the bushing member 350 is able to be stably locked with the bezel member 101 by holding the loading member 370 in a manner of having its lower part 356 penetrate the penetrating hole 370*h* of the loading member 370 and the locking hole 101*h* of the recessed part in turn and having its upper part 351 caught by the locking hole 101*h* instead of being inserted into the locking hole 101*h*.

Meanwhile, screw threads can be formed on an outer lateral side of the lower part of the bushing member 350 and an inner lateral side of the locking hole 101*h* of the bezel member 101 to correspond to each other. By the screw threads, the bushing member 350 can be screwed to the bezel member 101 as well as holds the loading member 370 at the lateral side of the bezel member 101.

In particular, the bushing member 350 is screwed to the bezel member 101 as soon as holds the loading member 370. And, the bushing member 350 provides a passage for the penetrating part 316 of the side key 310 to extend into the mobile terminal.

In this case, a via hole 353 can be provided to the bushing member 350 to enable the penetrating part 316 to extend into the bezel member 101 via the bushing member 350. In particular, the via hole 353 can be formed in a length direction of the bushing member 350, and more particularly, in a locked direction of the bushing member 350 in order to be penetrated by the penetrating part 316 of the side key 310.

Thus, since the bushing member 350 is screwed to the bezel member 101, a separate locking member is unnecessary and an assembling process can be simplified. Moreover, the bushing member 350 facilitates the side key to be disassembled for the maintenance and repair in the future as well as the assembling process.

Figure 6:
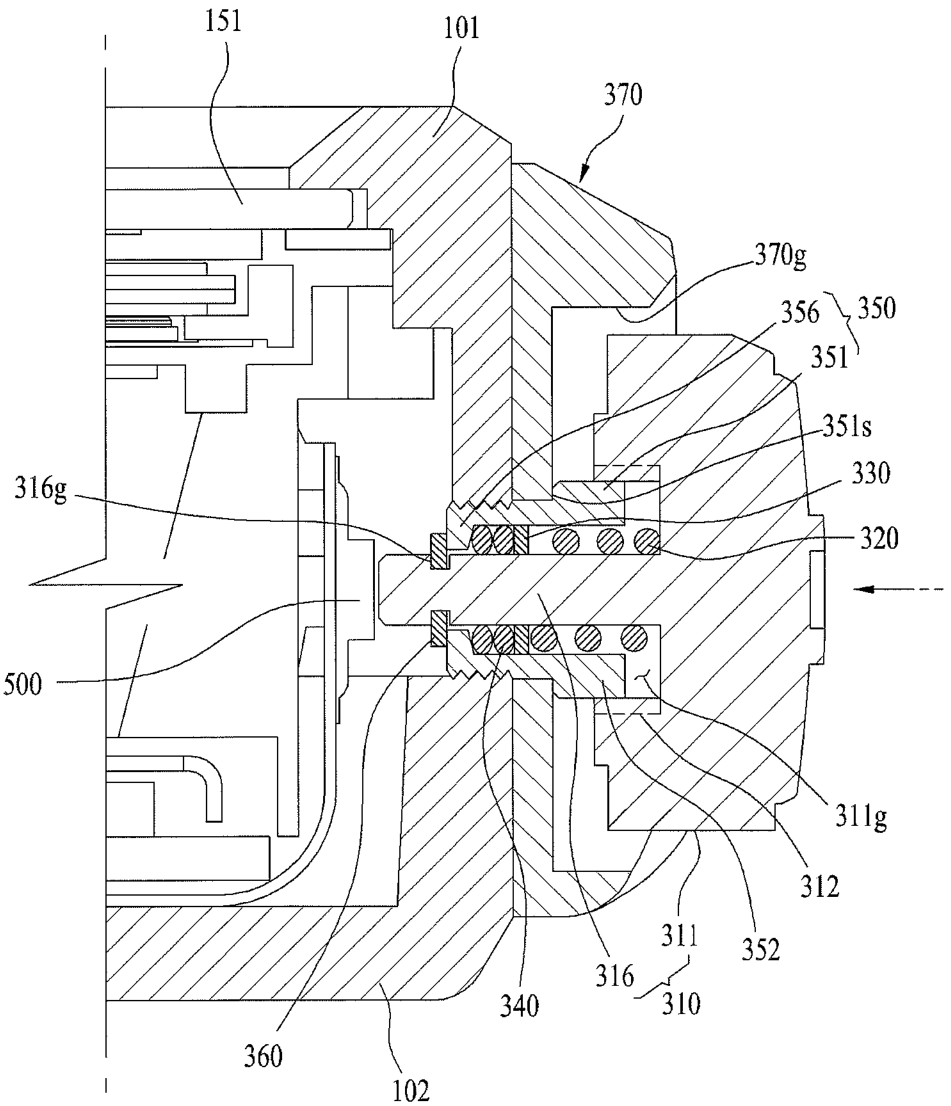
FIG. 6 and FIG. 7 are cross-sectional diagrams of a side key of a mobile terminal according to one embodiment of the present invention.
Figure 7:
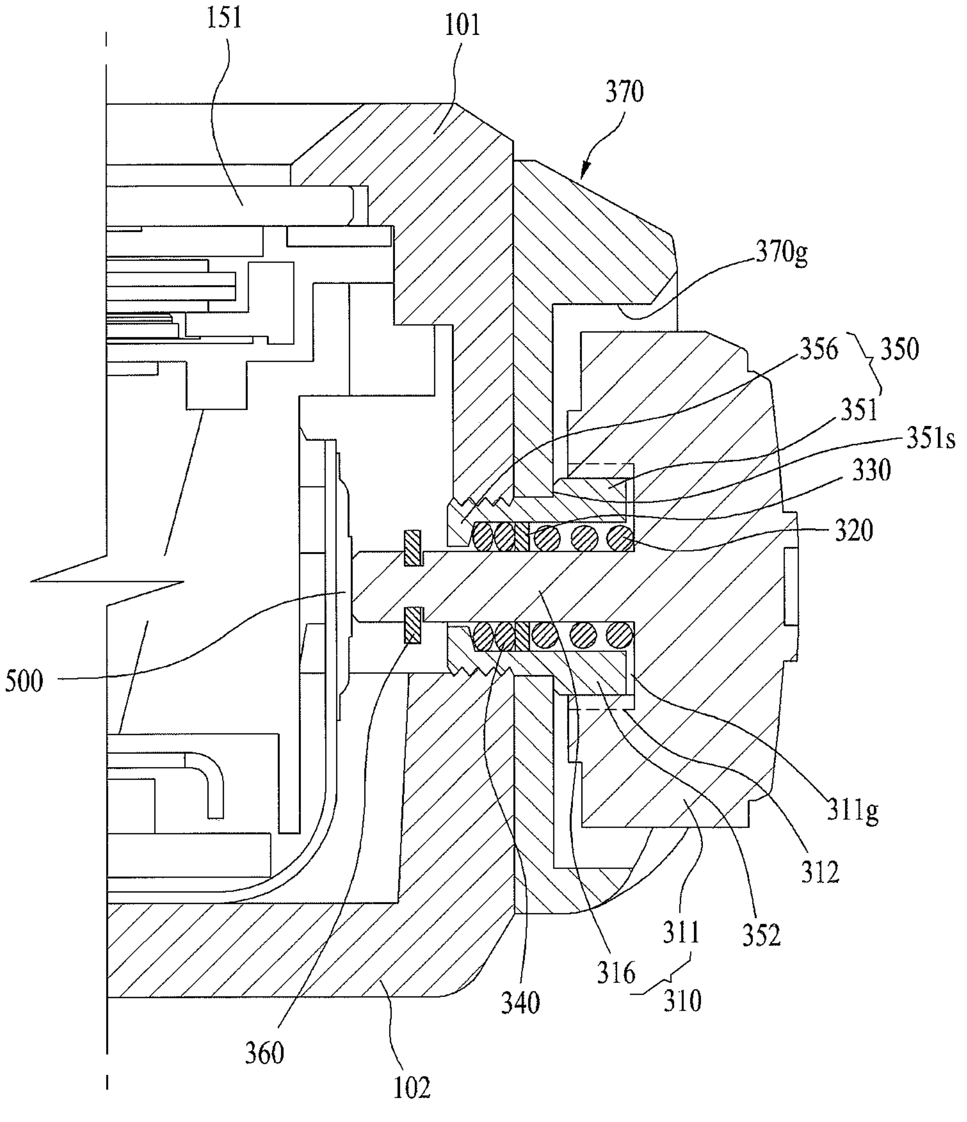

FIG. 6 and FIG. 7 are cross-sectional diagrams of a side key 310 of a mobile terminal according to one embodiment of the present invention. In particular, FIG. 6 is a cross-sectional diagram of the side key 310 and its surroundings when the side key 310 is not pressurized. And, FIG. 7 is a cross-sectional diagram of the side key 310 and its surroundings when the side key 310 is pressurized.

Referring to FIG. 6, a head part 311 of the side key 310 is loaded on a loading recess 370*g* of the loading member 370. In doing so, a spacing distance is preferably provided to prevent a lateral side of the head part 311 from being brought into contact with a lateral side of the loading recess 370*g* of the loading member 370. As each of the side key 310 and the loading member 370 is made of a metal material, it is able to prevent a malfunction attributed to the friction between the two members made of the metal materials.

A guide recess 311*g* can be provided to a bottom side of the head part 311. An upper part 351 of the bushing member 350, which is not inserted into the loading member 370 or the locking hole of the bezel member 101 is inserted in the guide recess 311*g*. When the side key 310 is pressurized, the upper part 351 of the bushing member 350 can be guided by the guide recess 311*g*.

The guide recess 311*g* is a region in which the upper part 351 of the bushing member 350 is inserted. And, the guide recess 311*g* guides a displacement process when the side key 310 is pressurized. A depth of the guide recess 311*g* is associated with a displacement range when the side key 310 is pressurized. In particular, the depth of the guide recess 311*g* is determined to limit the displacement range in case of the pressurization of the side key 310 as well as enable a dome switch 500 within the mobile terminal to be pressurized.

As mentioned in the foregoing description, the guide recess 311*g* provided at the bottom side of the head part 311 of the side key 310 guides the pressurized displacement process of the side key 350 when the upper part 351 of the bushing member 350 is inserted.

Therefore, the upper part 351 of the bushing member 350 is not inserted in the loading member 370 or the locking hole 101*h* of the bezel member 101. Therefore, the bushing member 350 can be provided with a step difference 351*s* for limiting a locked depth with the bezel member 101. According to the step difference 351*s*, the locked depth of the bushing member 350 is determined. And, according to the step difference 351*s*, a locked force with the bezel member 101 can be reinforced. In this case, the step difference 351*s* can be supported in a manner of being brought into contact with a bottom side of the loading recess 370*g* of the loading member 370.

In particular, the upper part 351 (i.e., a right region in the drawing) of the bushing member 350 is a thick part due to the step difference and the lower part 356 (i.e., a left region in the drawing) of the bushing member 350 is a thin part. And, as mentioned in the foregoing description, a screw thread can be formed on a locked portion with the bezel member 101.

A penetrating part 316 extending from the bottom side of the head part 311 of the side key 310 has a bar shape and extends into the mobile terminal via the bushing member 350. A hooking recess 316*g* can be formed on an end portion of the penetrating part 316. A fixing ring 360 is provided to the hooking recess 316*g* to prevent the side key 310 from being separated. In this case, in case of pressurization, referring to FIG. 7, the end portion of the penetrating part 316 pressurizes a dome switch 500 or the like provided within the mobile terminal to generate a control signal.

An elastic member 320 and a sealing member 340 can be further provided within the bushing member 350. In this case, the sealing member 340 is provided to prevent such liquid as water or such particle as dust and the like from entering the mobile terminal. And, the elastic member 320 provides an elastically repulsive force for enabling the side key 310 to return to its original position in case of pressurizing the side key 310.

In particular, as the elastic member 320 is provided within the bushing member 350, it is able to provide the elastically repulsive force toward the head part 311 of the side key 310 in case of pressurizing the side key 310. Moreover, the elastic member 320 includes a coil spring. One end of the coil spring is supported within the hushing member 350, while the other end of the coil spring can be brought into contact with the bottom surface of the guide recess 311*g*.

The sealing member 340 can be made of a ring type rubber material or the like. And, a plurality of the sealing members can be provided. In FIG. 6 and FIG. 7, two sealing member 340 are stacked on each other in the mobile terminal according to the present invention. In this case, the elastic member 320 can include a coil spring or the like. No limitation is put on a type of the elastic member 320, so long as the elastic member 320 is able to provide an elastically repulsive force in case of compression.

The sealing member 340 is provided within the bushing member 350. And, the elastic member 320 can be provided outside the bushing member 350 to be brought into contact with the bottom surface of the head part 311 of the side key 310.

A partitioning member 330 can be further provided between the elastic member 320 and the sealing member 340. In this case, the partitioning member 330 is provided to separate the elastic member 320 and the scaling member 340 from each other and to prevent the elastic member 320 from being brought into contact with the sealing member 340.

If the elastic member 320 and the sealing member 340 are directly brought into contact with each other, durability of the sealing member 340 is lowered and the elastically repulsive force may not be sufficiently generated. Therefore, the partitioning member 300 is provided between the elastic member 320 and the sealing member 340 to separate the elastic member 320 and the sealing member 340 from each other and to reinforce the sealing.

The head part 311 of the side key 310, as shown in FIG. 4, can be configured as a circular shape. And, the loading recess 370*g* of the loading member 370 can have a shape corresponding to the circular head part 311. Therefore, the side key 310 can be rotated centering on the penetrating part 316.

Referring to FIGS. 4 to 7, at least one rotation preventing projection 352 and at least one rotation preventing recess 312 can be provided to an outer lateral side of the bushing member 350 (i.e., an outer lateral side of the upper part) and an inner lateral side of the guide recess 311*g* to mutually engage with each other, respectively. In this case, the rotation preventing projection 352 and the rotation preventing recess 312 can be formed in a direction in parallel with a displacement direction of the side key 310. A plurality of the rotation preventing projections 352 and a plurality of the rotation preventing recesses 312 are repeatedly formed in parallel with each other. The projections are inserted in the recesses, respectively. Hence, when the side key 310 is pressurized, the displacement occurs in the pressurizing direction only. And, it is able to prevent the rotation of the side key 310 centering on the penetrating part 316.

Figure 8:
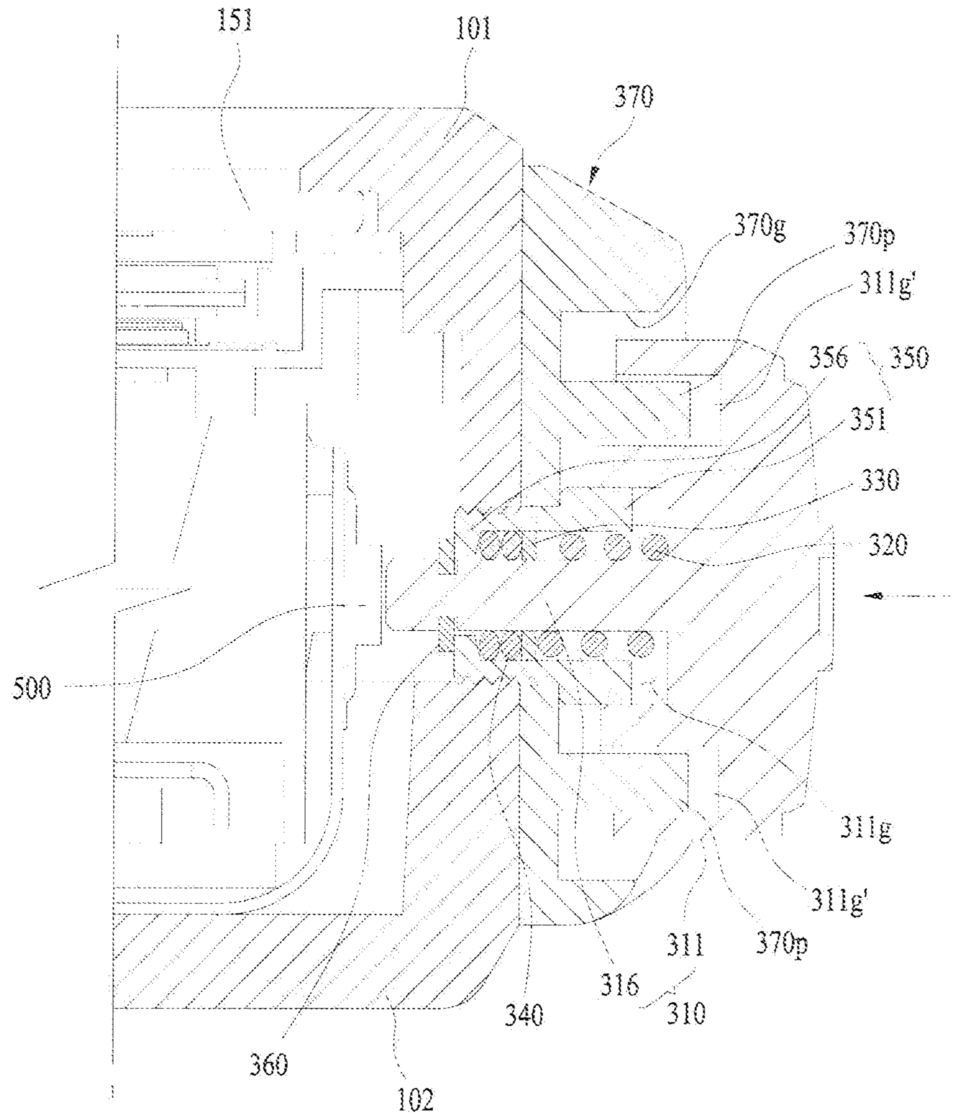
FIG. 8 is a cross-sectional diagram of a side key of a mobile terminal according to another embodiment of the present invention.

FIG. 8 is a cross-sectional diagram of a side key of a mobile terminal according to another embodiment of the present invention. The redundant descriptions described with reference to FIGS. 2 to 7 shall be omitted from the following description.

Referring to FIG. 8, when a side key 310 is loaded on a lateral side of a bezel member 101 or the like in a mobile terminal of a wristwatch type, if a pressurization is precisely performed in an intended pressurizing direction, there will be no problem. Yet, if a pressurizing force of pressurizing the side key 310 is obliquely applied, a head part of the side key 310 may incline toward one side and may interrupt an insertion of a penetrating part by pressurization.

According to the embodiment shown in FIG. 8, a guide recess 311*g* is provided to a bottom side of a head part 311 of the side key 310. As the bushing member 350 is inserted in the guide recess 311*g*, a motion in a pressurizing process is guided. Yet, since the guide home 311*g* is situated at a central portion of the head part 311, if the head part 311 of the side key 310 is pressurized in an oblique direction, it is not enough to prevent an inclination or a lean of the side key 310.

The mobile terminal shown in FIG. 8 includes an auxiliary guide recess 311*g*' provided to the bottom side of the head part 311 of the side key 310. In this case, the auxiliary guide recess 311*g*' can be provided to a symmetric position by leaving the guide recess 311*g* in-between.

Moreover, a guide bar 370*p* can be provided to the bottom side of the loading recess 370*g* of the loading member 370. In this case, the guide bar 370*p* is inserted in the guide recess 311*g*' to be guided therein. In particular, the guide bar 370*p* can be provided to match the number and positions of the auxiliary guide recesses 311*g*'. In more particular, the guide bar 370*p* can have a column shape.

Referring to FIG. 8, in case that the auxiliary guide recess 311*g*' and the guide bar 370*p* are provided, it is able to prevent the side key 310 from being rotated in a random direction. Therefore, it is able to omit the at least one rotation preventing projection 352 and the at least one rotation preventing recess 312, which are provided to the outer lateral side (i.e., the outer lateral side of the upper part) of the bushing member 350 and the inner lateral side of the guide recess to engage each other, in the embodiment shown in FIG. 4 and FIG. 5.

Alternatively, positions of the guide bar 370*p* and the auxiliary guide recess 311*g*' can be switched to each other. In particular, the guide bar is provided to the bottom side of the head part 311 of the side key 310 and the auxiliary guide recess can be provided within the loading recess 370*g* of the loading member 370.

Figure 9:
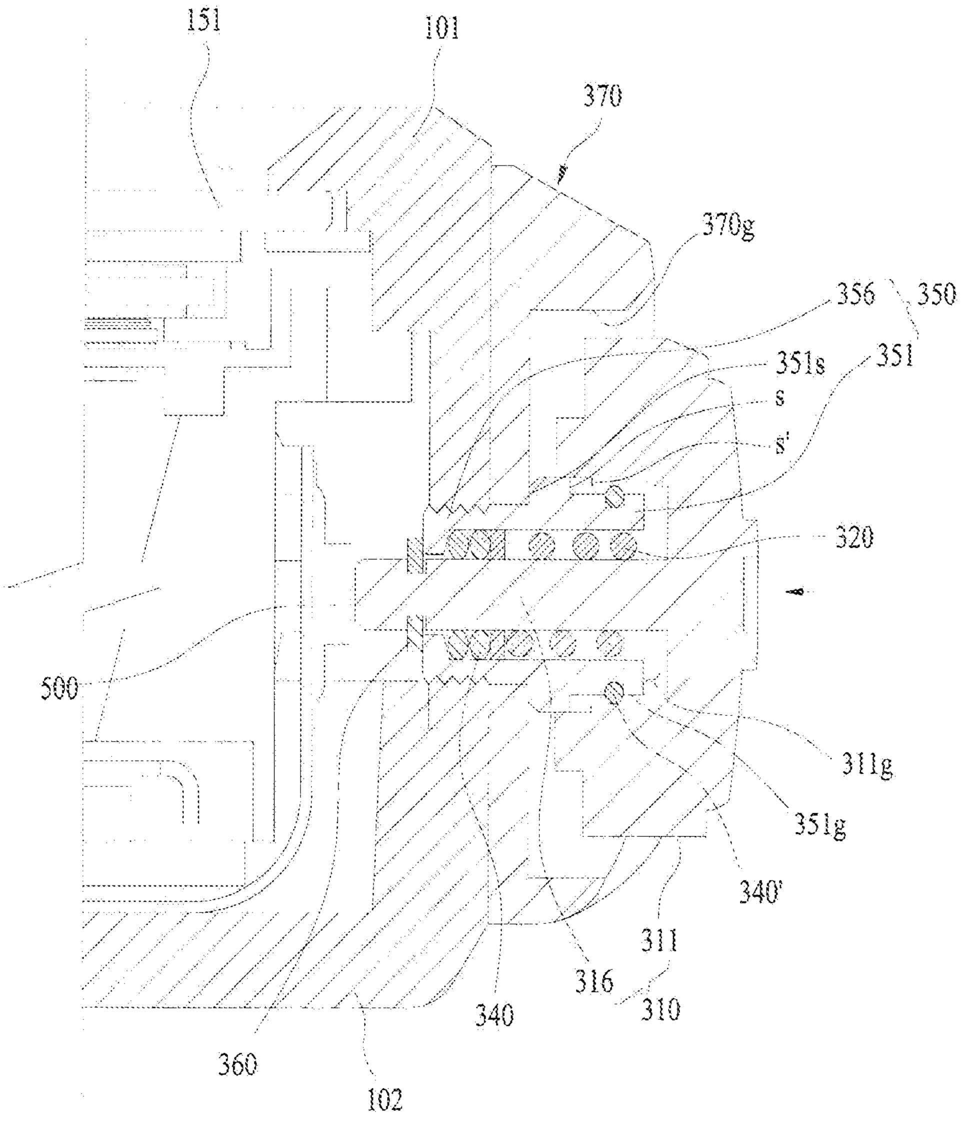
FIG. 9 is a cross-sectional diagram of a side key of a mobile terminal according to a further embodiment of the present invention.

FIG. 9 is a cross-sectional diagram of a side key of a mobile terminal according to a further embodiment of the present invention. The redundant descriptions with reference to FIGS. 2 to 8 are omitted from the following description.

A side key of a mobile terminal shown in FIG. 9 differs from the former side key shown in FIG. 7 or FIG. 8 in further comprising an auxiliary sealing member 340' configured to secure waterproof performance.

Although the sealing member 340 in the embodiment shown in FIG. 7 or FIG. 8 is provided within the bushing member 350 only, the present embodiment can further include a sealing member for the perfect scaling.

Referring to FIG. 9, the further included auxiliary sealing member 340' is provided between a guide recess 311*g* provided to a bottom side of a head part 311 of a side key 310 and an outer lateral side of an upper part 351 of a bushing member 350.

And, a sealing recess 351*g* for lading the auxiliary sealing member 340' can be further provided to the outer lateral side of the upper part 351 of the bushing member 350.

Moreover, a step differences corresponding to the outer lateral side of the upper part 351 of the bushing member 350 and a step difference s' corresponding to an inner lateral side of the guide recess 311*g* are provided to limit a pressurization range of the side key 310 and to enhance the water performance by bending a passage of water penetration or the like.

A head part 311 of the side key 310 and a loading recess 370*g* of the loading member 370 have circular shapes, respectively. A diameter of the head part 311 of the side key 310 can be smaller than that of the loading recess 370*g* of the loading member 370.

In this case, in order to prevent friction between the side key 310 and the loading recess 370*g* of the loading member 370, even if a width of the loading recess 370*g* is set greater than the diameter of the head part 311 of the side key, it is able to double-block the introduction of such fluid as water, which may penetrate a space between the loading recess 370*g* and the head part 311 of the side key 310, using the step differences s and s', the auxiliary sealing member 340' and the sealing member 340.

Figure 10:
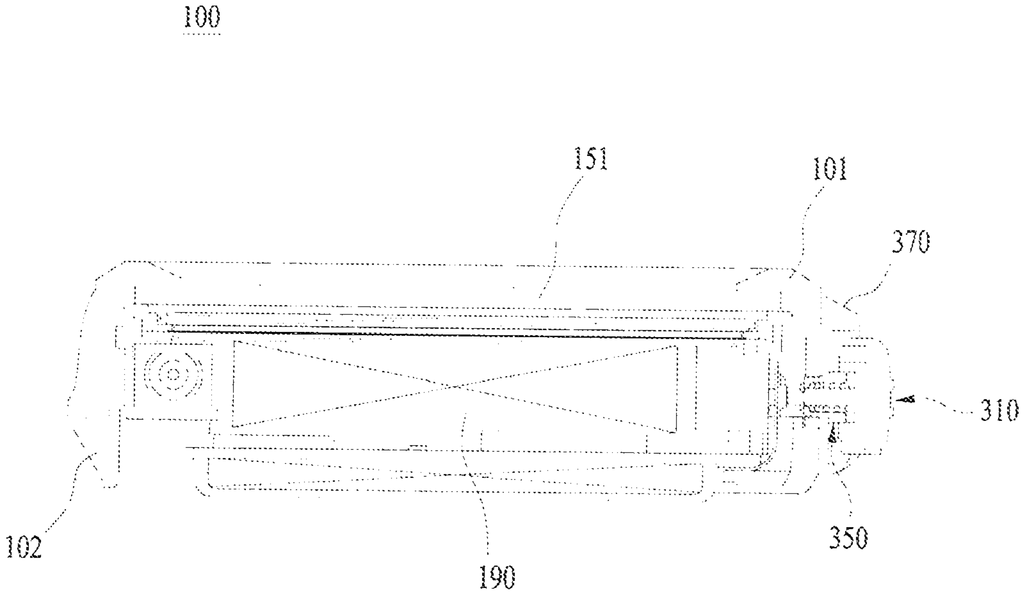
FIG. 10 is a cross-sectional diagram of a mobile terminal according to the present invention.

FIG. 10 is a cross-sectional diagram of a mobile terminal according to the present invention.

Referring to FIG. 10, a mobile terminal 100 according to the present invention includes a bezel member 101 configured to expose a display unit 151 in a circular or oval shape by forging, at least one side key 310 provided to a lateral side of the bezel member 101 to generate a control signal according to a selective pressurization, and a bushing member 350 screwed to the bezel member 101 to displaceably load the side key 310 on the lateral side of the bezel member 101 by pressurization.

The side key 310 is loaded on the lateral side of the bezel member 101. And, a backside cover 102 can be included to configure an exterior of the mobile terminal 100 together with the bezel member 101. In this case, the backside cover 102 can be made of a metal material as well.

The display unit 151 is supported by the bezel member 101 to be exposed on a top side of the mobile terminal 100. And, a battery can be provided as a power supply unit 190 under the display unit 151. Moreover, a circuit board for mounting various circuitry parts thereon and the like can be provided in parallel with the display unit 151.

Unlike a normal wrist watch, the present invention is provided with circuitry parts inside and requires waterproof functionality or shock-resistant rigidity.

Accordingly, the present invention adopts the side keys 210, 310 and 410 and the bezel member 101 shown in FIGS. 2 to 7, thereby securing the waterproof functionality or shock-resistant rigidity, raising the reliability of the side key selectively pressurized to generate a control signal, and enhancing maintenance and repair performance.

In the above description, so far, a wristwatch type mobile terminal is explained for example of a mobile terminal according to one embodiment of the present invention, by which the present invention is non-limited. For instance, the mobile terminal according to the present invention is applicable to a general mobile phone and the like.

Figure 11:
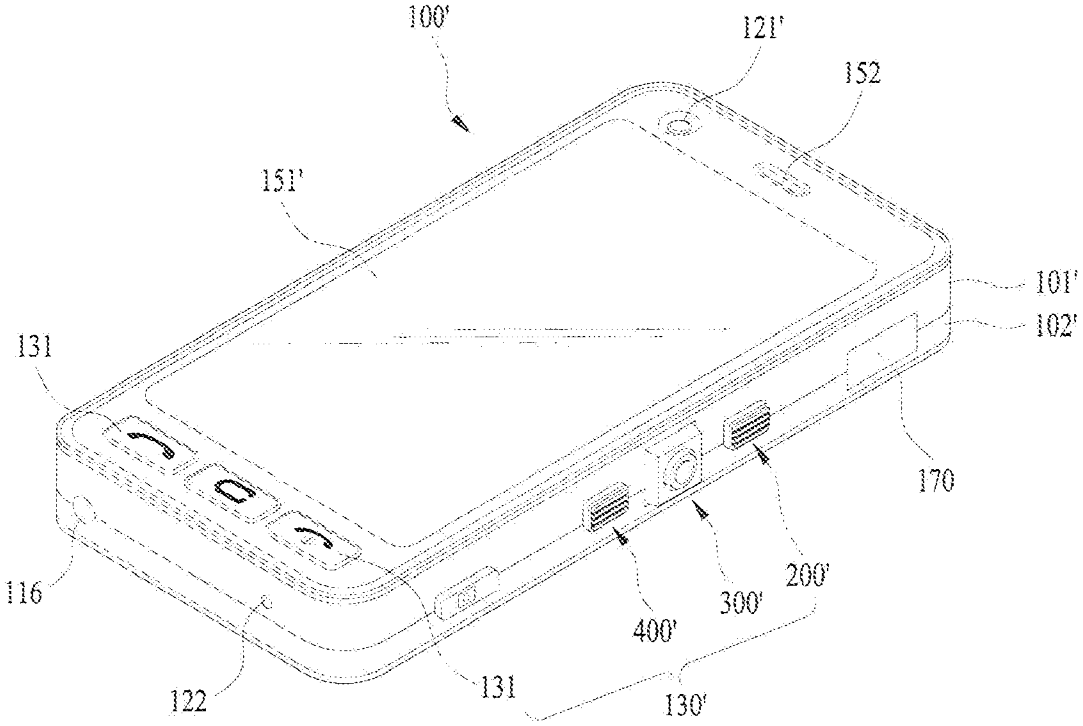
FIG. 11 is a perspective diagram of a mobile terminal according to another embodiment of the present invention.

FIG. 11 is a perspective diagram of a mobile terminal according to another embodiment of the present invention.

Referring to FIG. 11, the present invention is implemented with a mobile terminal 100' including a terminal body of a bar type. The mobile terminal 100' according to the present embodiment can include a display unit 151', a bezel member 101' configured to accommodate the display unit 151' to externally expose, and a rear cover 102' configured to form an exterior of the mobile terminal 100' together with the bezel member 101'.

A plurality of side key assemblies 200', 300' and 400' can be provided to a lateral side of the bezel member 101'. A plurality of the side key assemblies 200', 300' and 400' configure a user input unit 130' together with various buttons 131 provided to a front side of the bezel member 101'. The detailed structure or configuration of a plurality of the side key assemblies 200', 300' and 400' are similar to those of the aforesaid wristwatch type mobile terminal and its details are omitted.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A mobile terminal comprising:

a display unit;

a bezel member configured to accommodate the display unit therein;

a first side key including:

a head part exposed at a lateral side of the bezel member; and a penetrating part extending into the bezel member;

a loading member provided at the bezel member, the loading member having a loading recess configured to receive the head part of the first side key therein; and a bushing member connected to the bezel member, the bushing member attaching the loading member to the bezel member, wherein the head part of the first side key and the loading recess of the loading member have circular shapes, and a diameter of the head part of the first side key is smaller than that of a diameter of the loading recess of the loading member, wherein a guide recess is formed on a side of the head part of the first side key facing the bezel to receive an upper part of the bushing member inserted into the guide recess, wherein at least one rotation preventing projection is provide at one of an outer lateral side of the bushing member and an inner lateral side of the guide recess, and wherein at least one rotation preventing recess is provided at the other of the outer lateral side of the bushing member and the inner lateral side of the guide recess, the at least one rotation preventing projection engaging the at least one rotation preventing recess.

2. The mobile terminal of claim 1, wherein the bezel member includes a hole for securing the bushing member, and wherein the penetrating part of the first side key extends toward a signal input unit provided within the bezel member via the bushing member secured in the hole of the bezel member.

3. The mobile terminal of claim 2, wherein the signal input unit comprises a dome switch configured to generate a control signal by being selectively pressurized by the penetrating part of the first side key.

4. The mobile terminal of claim 2, wherein an outer lateral side of the bushing member includes a screw thread, wherein an inner lateral side of the locking hole includes a screw thread, and wherein the bushing member and the bezel member are secured to each other via the screw threads.

5. The mobile terminal of claim 2, wherein an outer lateral side of the bushing member includes a step difference, the step difference being supported by a surface of the loading member defining the recess.

6. The mobile terminal of claim 2, wherein displacement of the head part of the first side key is guided by the cooperation of the guide recess and the upper part of the bushing member.

7. The mobile terminal of claim 2, further comprising an elastic member provided within the bushing member to provide an elastically repulsive force toward the head part of the first side key.

8. The mobile terminal of claim 7, wherein the elastic member comprises a coil spring, one end of the coil spring being supported within the bushing member, and the other end of the coil spring being brought into contact with a surface defining the guide recess.

9. The mobile terminal of claim 7, further comprising a sealing member provided within the bushing member to prevent particles from being introduced into the mobile terminal.

10. The mobile terminal of claim 9, further comprising a partitioning member provided between the elastic member and the sealing member to prevent contact between the elastic member and the sealing member.

11. The mobile terminal of claim 10, further comprising an auxiliary sealing member provided between the guide recess and an outer lateral side of the upper part of the bushing member.

12. The mobile terminal of claim 6, wherein an auxiliary guide recess is formed on the side of the head part of the first side key facing the bezel, the guide recess being located between the penetrating part and the auxiliary recess, and wherein a guide bar is located at a bottom surface of the loading recess of the loading member, the guide bar being received in the auxiliary guide recess.

13. The mobile terminal of claim 1, wherein the rotation preventing projection and the rotation preventing recess are formed in a direction in parallel with a displacement direction of the first side key.

14. The mobile terminal of claim 1, wherein a shape of the loading recess of the loading member corresponds to that of the head part of the first side key.

15. The mobile terminal of claim 1, further comprising a second side key, wherein at least one of the first and second side keys is located on a curved lateral side of the bezel member.

16. The mobile terminal of claim 15, wherein a portion of the lateral side of the bezel member, on which the loading member is located, has a recess or a step difference formed therein.

17. The mobile terminal of claim 1, wherein the bezel member is formed by forging.

18. The mobile terminal of claim 1, wherein a portion of the penetrating part located internally of the bezel includes a hooking recess, and wherein a fixing ring is located in the hooking recess to prevent the first side key from being separated from the bezel member.

19. The mobile terminal of claim 1, wherein the bezel is formed of metal.

20. A mobile terminal comprising:

a display unit;

a bezel member configured to enable the display unit to be exposed therethrough;

at least one side key located on a lateral side of the bezel member, the at least one side key being displaceable to generate a control signal according to a selective pressurization of the at least one side key, the at least one side key including a head part exposed at a lateral side of the bezel member;

a loading member provided at the bezel member, the loading member having a loading recess configured to receive the head part of the at least one side key therein;

a bushing member connected to the bezel member, the bushing member being configured to guide displacement of the at least one side key; and at least one band member provided at an end of the bezel member, wherein the head part of the at least one side key and the loading recess of the loading member have circular shapes, and a diameter of the head part of the at least one side key is smaller than that of a diameter of the loading recess of the loading member, wherein a guide recess is formed on a side of the head part of the at least one side key facing the bezel to receive an upper part of the bushing member inserted into the guide recess, wherein at least one rotation preventing projection is provide at one of an outer lateral side of the bushing member and an inner lateral side of the guide recess, and wherein at least one rotation preventing recess is provided at the other of the outer lateral side of the bushing member and the inner lateral side of the guide recess, the at least one rotation preventing projection engaging the at least one rotation preventing recess.

* * * * *